United States Patent [19]

Kato et al.

[11] Patent Number: 5,582,647
[45] Date of Patent: Dec. 10, 1996

[54] MATERIAL SUPPLYING APPARATUS

[75] Inventors: Manabu Kato; Takashi Motoda; Tatsuya Kimura; Kaoru Kadoiwa; Zempei Kawazu; Nariaki Fujii, all of Itami, Japan

[73] Assignee: Mitsubishi Denki Kabushiki Kaisha, Tokyo, Japan

[21] Appl. No.: 358,465

[22] Filed: Dec. 19, 1994

[30] Foreign Application Priority Data

Jan. 14, 1994 [JP] Japan .................... 6-002377

[51] Int. Cl.$^6$ .................................. A01K 15/04
[52] U.S. Cl. ............... 118/715; 118/723 E; 118/726
[58] Field of Search ................. 118/715, 723 E, 118/726; 128/723 R; 204/190.13

[56] References Cited

FOREIGN PATENT DOCUMENTS

| | | |
|---|---|---|
| 63-85089 | 4/1988 | Japan . |
| 63-122117 | 5/1988 | Japan . |
| 6444011 | 2/1989 | Japan . |
| 3-112139 | 5/1991 | Japan . |
| 4-363131 | 12/1992 | Japan . |

*Primary Examiner*—R. Bruce Breneman
*Assistant Examiner*—FeLisa Garrett
*Attorney, Agent, or Firm*—Leydig, Voit & Mayer

[57] ABSTRACT

A material supplying apparatus includes a container for storing a solution; an inlet pipe for introducing a carrier gas and an outlet pipe; electrodes disposed in the container over the depth direction of the container and forming a capacitor; and apparatus for calculating a residual amount of the solution in the container from the capacitance of the capacitor formed by the electrodes. The solution is used as the dielectric of the capacitor formed in the container and the capacitance varies according to the quantity of solution so that the residual amount of the solution and the time to replenish the solution are calculated in a simple structure having no moving parts.

4 Claims, 8 Drawing Sheets

MATERIAL SUPPLYING APPARATUS

BACKGROUND OF THE INVENTION

1. Field of the Invention

The present invention relates to an apparatus for performing crystal growth of a metal or a semiconductor and, more particularly, to an apparatus for performing crystal growth using a vapor-phase growth method, in which an apparatus for supplying a material gas is improved.

2. Description of the Prior Art

FIG. 8 is a sectional view of a bubbling apparatus a conventional material supplying apparatus. In FIG. 8, a container body 1 is made of SUS, a material solution 2 is stored in the container body 1, a carrier gas inlet pipe 3 has one end put into the material solution in the container body 1, and a gas outlet pipe 4 has one end disposed so as not to come into contact with the material solution 2 in the container body 1. In addition, a back pressure control valve 20 is disposed in the gas outlet pipe 4, whereby an amount of material gas to be taken out can be controlled and kept constant. In addition, a constant temperature bath 21 surrounds the container body 1 and heats it so the vapor in the container body is in a saturated state in the constant temperature bath 21.

Then, an operation of the apparatus in the crystal growth process will be described.

As shown in FIG. 8, a carrier gas (for example, hydrogen) which does not react with the material solution 2 is introduced from the carrier gas inlet introducing pipe 3 into the container body 1 storing the material solution 2, such as TMA (trimethylaluminum), TMG (trimethylgallium) or TEG (triethylgallium), and a material gas according to vapor pressure of the material and an amount of the introduced carrier gas flows out of the container with the carrier gas. Thus obtained material gas is introduced to a reaction chamber (not shown) and used for crystal growth.

According to the thus structured conventional material supplying apparatus, there is no means for displaying a residual amount of the material solution in the container or a time to exchange the material solution. Therefore, in order to prevent the material solution in the container body 1 from being exhausted, it is necessary to calculate the amount of the material used from the amount of the material consumed per unit time using the vapor pressure which depends upon temperature, the flow rate of carrier gas, and the pressure in the container, and then to estimate the time for replenishing the material solution 2 from the difference between the consumed amount of the material solution and an initial amount of the material solution.

Then, in order to solve the above-described problem, for example, Japanese Published Patent Application No. Hei. 4-363131 discloses a system in which a float is disposed in the container storing the material solution as a liquid surface sensor and the position of the liquid surface is detected by detecting a position of the float. According to the technique disclosed in this publication, the flow of the carrier gas is controlled according to the thus detected liquid surface position, whereby a decrease in concentration of the material gas supplied per unit time is compensated by increasing the amount of supply of the carrier gas. In this system, however, it is necessary to provide a moving part in the container and a sensor for detecting the position of the moving part (a float in this case), so that the structure becomes complicated and a problem in reliability or costs could be generated.

As described above, since the conventional material supplying apparatus is thus structured, the structure for detecting the position of the liquid surface in the container storing the material solution is complicated and the reliability is low.

SUMMARY OF THE INVENTION

It is an object of the present invention to provide a material supplying apparatus easily detecting the residual amount of a material or the time to exchange the material in a simple structure.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, a material supplying apparatus comprises electrodes disposed so as to form a capacitor in the container and calculating means for calculating a residual amount of a material solution in the container by measuring capacitance of the capacitor formed by the electrodes. Thus, the material solution is used as the dielectric of the capacitor formed in the container and the capacitance of the capacitor varies according to a decrease in the material solution is detected, whereby the residual amount of the material solution and the time to exchange the material can be calculated in a simple structure having no moving part.

According to a second aspect of the present invention, a material supplying apparatus comprises a light emission device whose emitting point is disposed at a bottom or an upper portion of the container, a light receiving device disposed at the bottom or the upper portion of the container, for receiving light from the emission device, and calculating means for calculating the quantity of the material solution in the container from the intensity of the light received by the light receiving device. Thus, a residual amount or a time to exchange the material solution can be calculated in a simple structure having no moving part by detecting the amount of attenuation of light which varies according to the residual amount of the material solution.

According to a third aspect of the present invention, a material supplying apparatus comprises a light emission device whose emitting point is disposed at a bottom or an upper portion of the container, a light receiving device disposed at the bottom or the upper portion of the container, for receiving light from the emission device, and calculating means for calculating the quantity of the material solution in the container from time taken for the light to reach the light receiving device from the emitting point. Thus, a residual amount or a time to exchange the material solution can be calculated in a simple structure having no moving part by detecting the transit time of which varies according to the residual amount of the material solution.

According to a fourth aspect of the present invention, a material supplying apparatus comprises buoyancy measuring means comprising a pressure sensor provided in the container and a stick having one end fixed to the pressure sensor and the other end immersed in the material solution, and calculating means for calculating the quantity of the material solution in the container from the buoyancy measured by the buoyancy measuring means. Thus, a residual amount or a time to exchange the material solution can be calculated in a simple structure having no moving part by the buoyancy of the stick which varies according to the residual amount of the material solution.

According to a fifth aspect of the present invention, a material supplying apparatus comprises a pressure sensor disposed in the container, for measuring liquid pressure at a bottom of the container, and calculating means for calculating the quantity of the material solution in the container from the liquid pressure measured by the pressure sensor. Thus, a residual amount or a time to exchange the material solution

DESCRIPTION OF THE PREFERRED EMBODIMENTS

Embodiment 1

Figure 1:
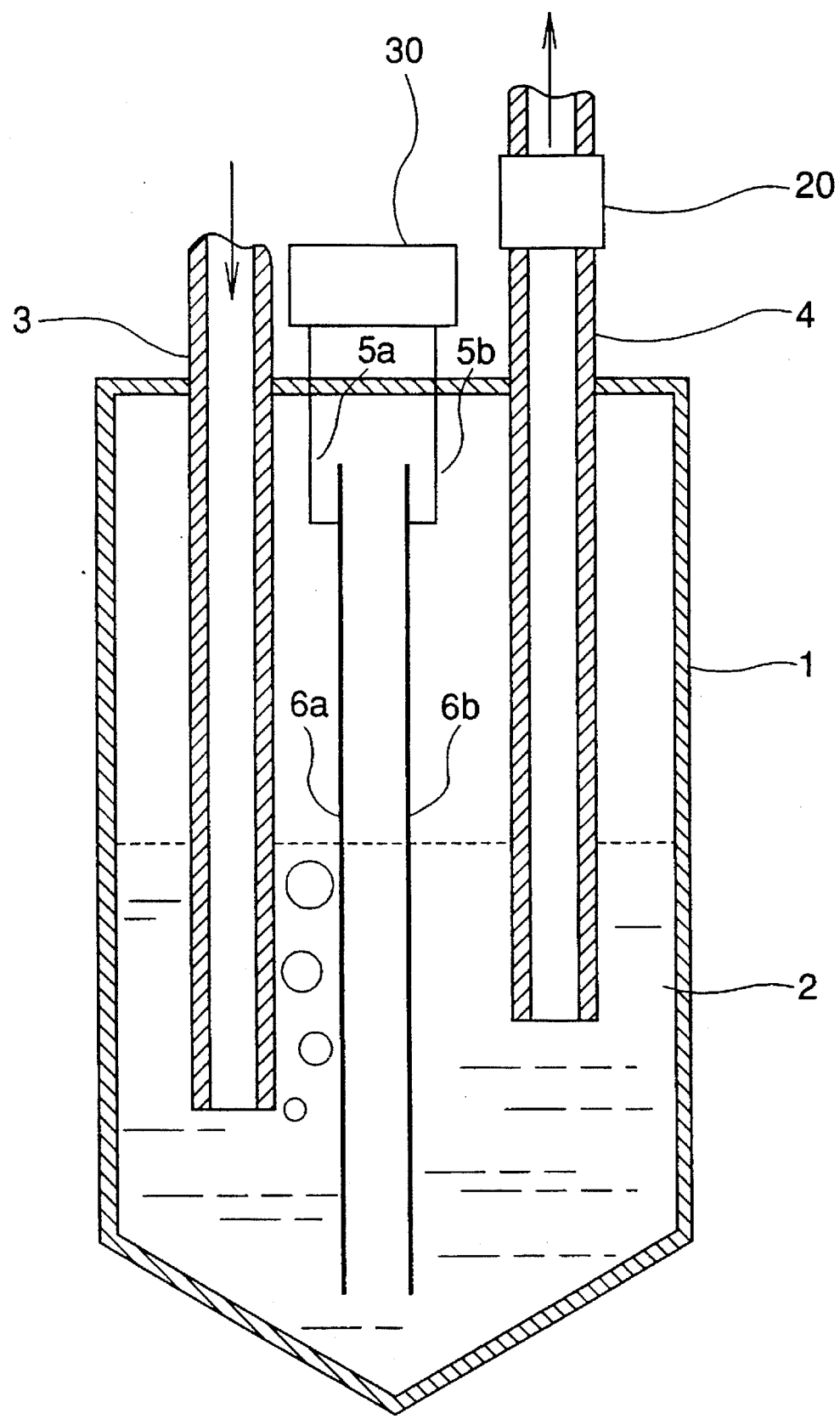
FIG. 1 is a sectional view showing a material supplying apparatus according to a first embodiment of the present invention.
Figure 8:
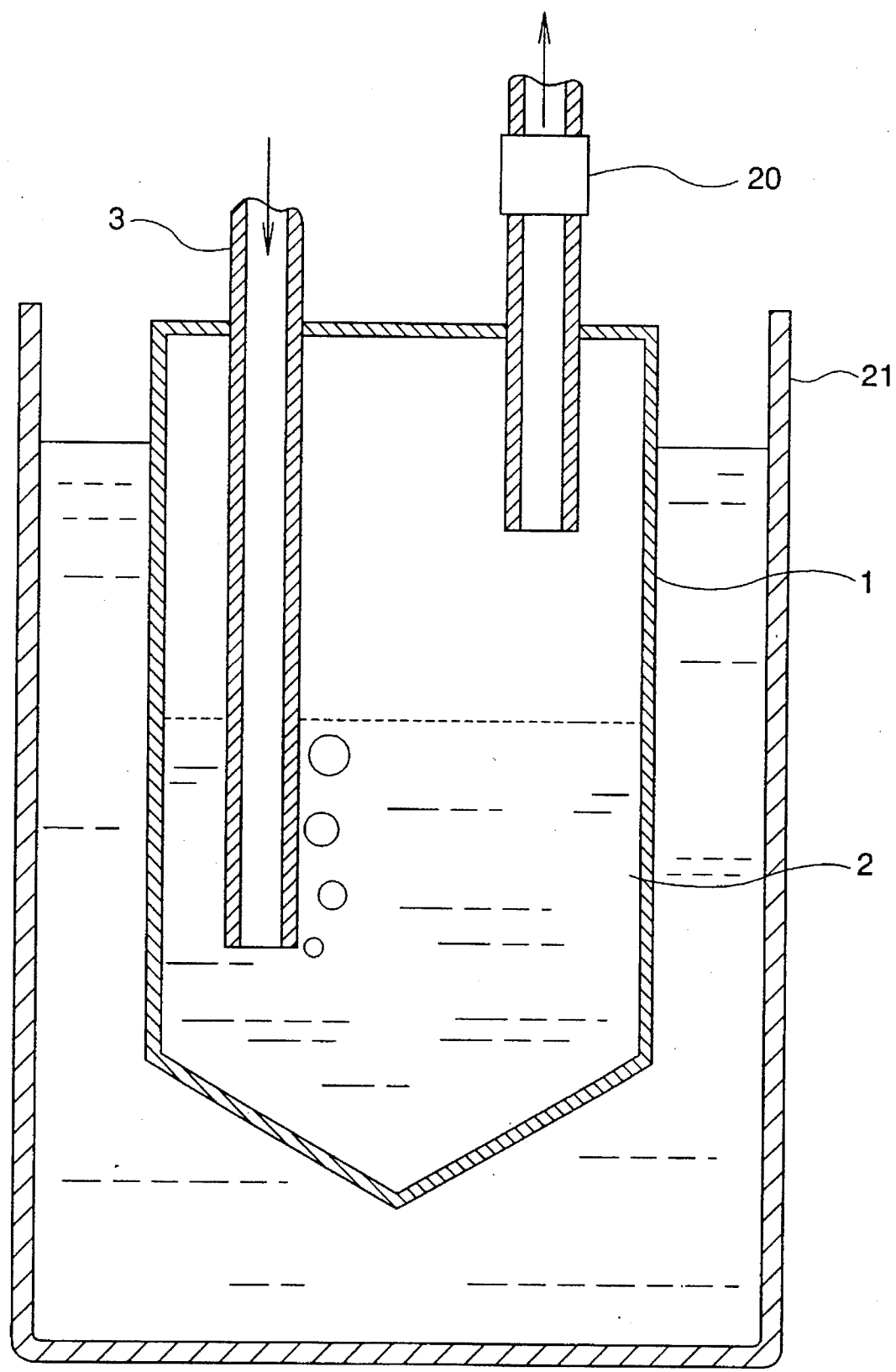
FIG. 8 is a sectional view showing a conventional material supplying apparatus.

FIG. 1 is a sectional view showing a material supplying apparatus according to a first embodiment of the present invention. In FIG. 1, the same references designate the same or corresponding parts as in FIG. 8. In addition, capacitor electrodes 6a and 6b are made of SUS, and wirings 5a and 5b are electrically connected to the capacitor electrodes 6a and 6b, respectively. The wirings 5a and 5b measure electrical capacitance and are connected to calculating means 30 in which electrical capacitance in the liquid container 1 is stored. In addition, each of the capacitor electrodes 6a and 6b is disposed in the container in such a manner that a part thereof is immersed in the material liquid and another part thereof is disposed in the vapor phase. In addition, a constant temperature bath is omitted in the figure and in each following embodiment.

Next, an operation of the apparatus at the time of crystal growth will be described.

Carrier gas is introduced from the carrier gas inlet pipe 3. When gas is blows out through the gas outlet pipe 4, the material solution 2 is evaporated and taken out of the container 1 with the carrier gas through the pipe 4. Then, the amount of the material solution 2 in the container 1 is reduced, whereby the liquid surface of the material solution 2 is lowered and an amount of material present between the electrodes 6a and 6b as a dielectric substance is reduced. Accordingly, capacitance of the capacitor formed by the electrodes 6a and 6b varies. More specifically, the capacitance of the capacitor formed by the electrodes 6a and 6b is increased as the liquid surface is lowered. Therefore, since the quantity of the solution corresponds to the capacitance of the capacitor, it can be determined from the detected capacitance of the capacitor by the calculating means 30, whereby the residual amount of the material solution can be determined.

Thus, according to the first embodiment of the present invention, the electrodes 6a and 6b each having a part immersed in the material solution 2 are provided in the container 1, the capacitor in which the material solution 2 between the electrodes 6a and 6b is used as a dielectric substance is formed, and the capacitance of the capacitor is monitored by the calculating means 30, whereby the residual amount of the material solution 2 is detected. Consequently, the residual amount of the material solution 2 can be detected in a simple structure without providing a moving part in the container 1. Thus the, reliability of the apparatus can be improved and manufacturing costs can be reduced.

Embodiment 2

Figure 2:
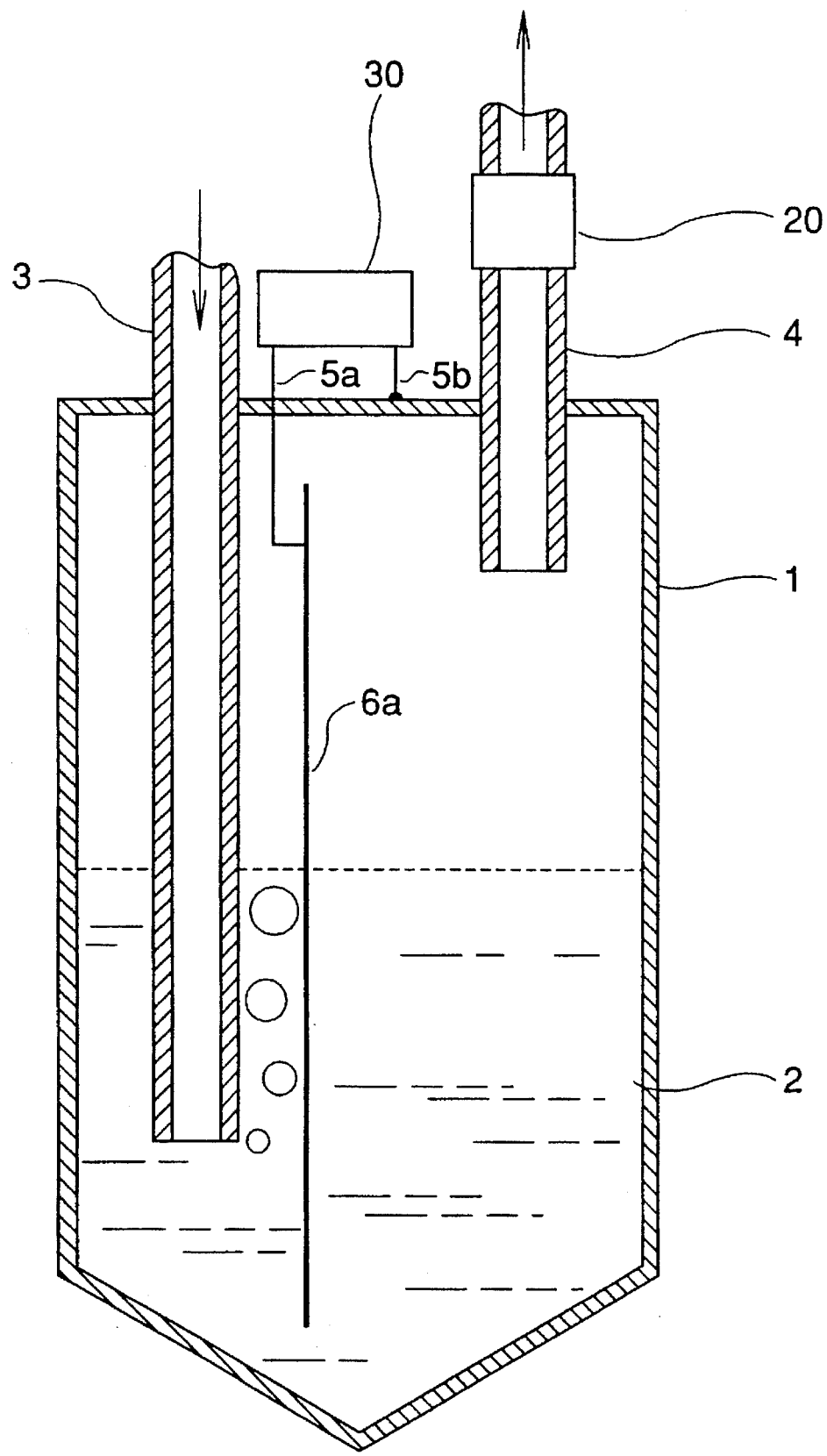
FIG. 2 is a sectional view showing a material supplying apparatus according to a second embodiment of the present invention.

FIG. 2 is a sectional view showing a material supplying apparatus according to a second embodiment of the present invention. According to the second embodiment of the present invention, the container 1 is used as one electrode of the capacitor rather then the capacitor formed using parallel plates in the above-described first embodiment of the present invention. The structure other than the above is the same as in the first embodiment.

Since the container 1 is used as one electrode of the capacitor, the structure can be simpler than in the first embodiment of the present invention.

Embodiment 3

Figure 3:
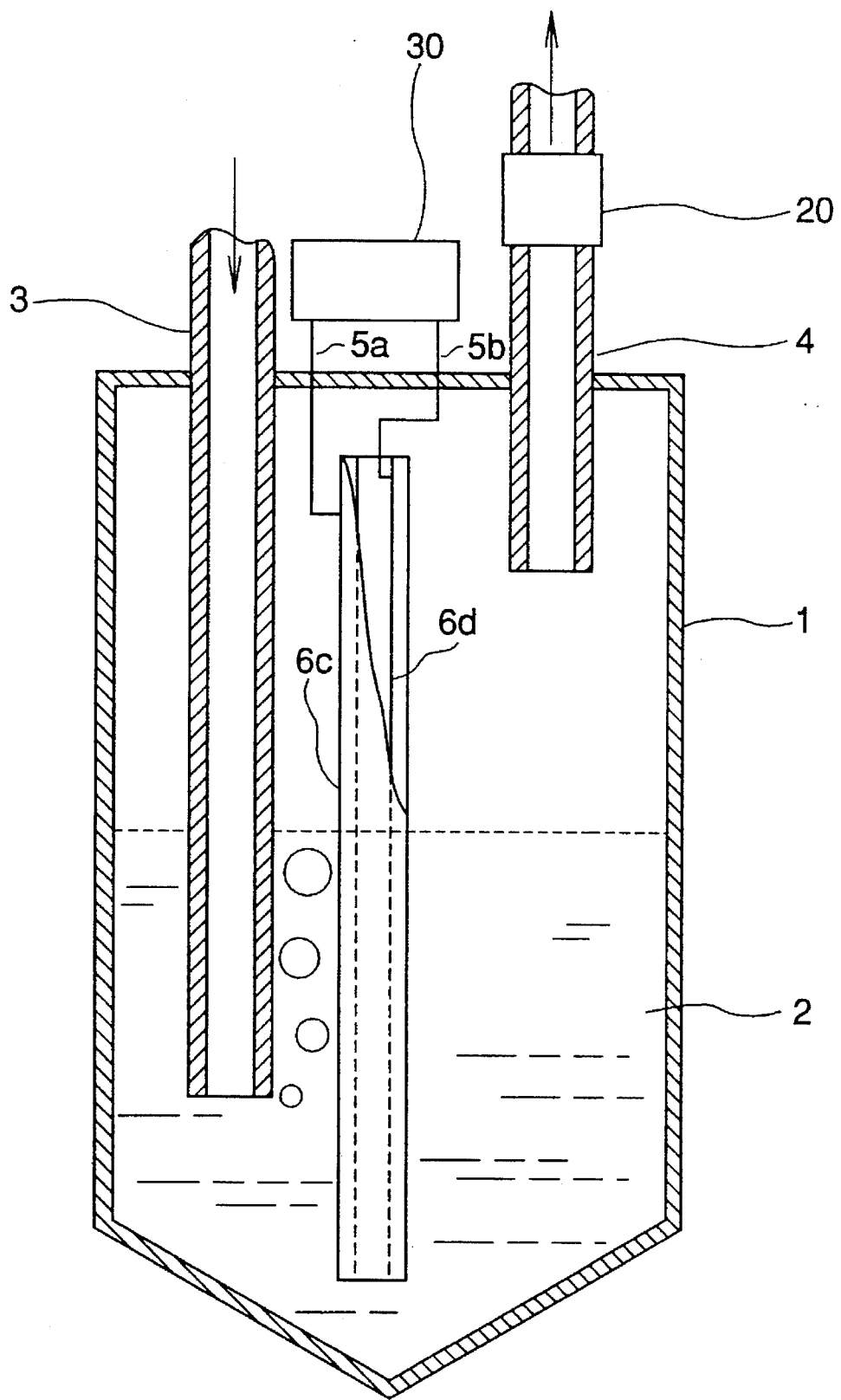
FIG. 3 is a sectional view showing a material supplying apparatus according to a third embodiment of the present invention.

FIG. 3 is a sectional view showing a material supplying apparatus according to a third embodiment of the present invention. According to the third embodiment of the present invention, a capacitor is formed by disposing a cylindrical or columnar electrode 6d inside a cylindrical electrode 6c as a capacitor instead of using parallel plates as in the above-described first embodiment of the present invention. The structure other than the above is the same as in the embodiment 1 of the present invention.

Since the capacitor has a double-cylindrical structure, the quantity of bubbles of the carrier gas introduced from the pipe 3 at the time of crystal growth which attach to the capacitor electrodes is reduced and then the, precision of the capacitance measurement is improved.

Embodiment 4

Figure 4:
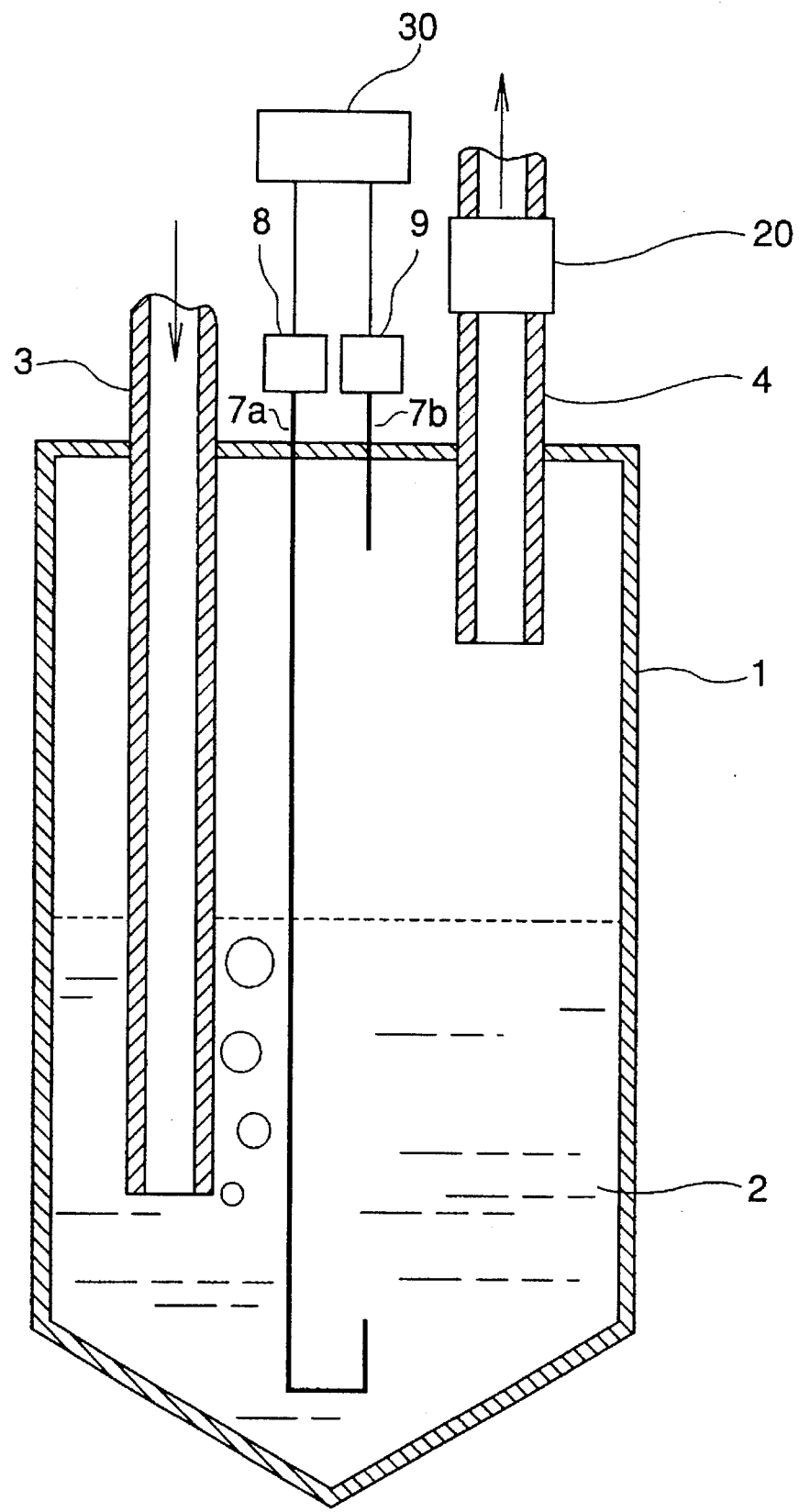
FIG. 4 is a sectional view showing a material supplying apparatus according to a fourth embodiment of the present invention.

FIG. 4 is a sectional view showing a material supplying apparatus according to a fourth embodiment of the present invention. In FIG. 4, light waveguides 7a and 7b are formed of, for example, optical fibers. One end of the light waveguide 7a is optically connected to a point light source 8 comprising, for example, 'a laser' or LED (light-emitting diode), outside the container 1 and the other end thereof is immersed in the material solution 2 in the container 1 and bent upward therein. In addition, one end of the light waveguide 7b is optically connected to light detecting means 9, such as photodiode or phototransistor, outside the container 1 and the other end of thereof is disposed above the liquid surface of the material solution 2 in the container 1 and opposite the position of an incident light output from the end of the light waveguide 7a immersed in the material solution 2.

Next, an operation of the apparatus at the time of crystal growth will be described.

The intensity of light supplied from the point light source 8, output from the end of the light waveguide 7a in the container through the light waveguide 7a and reaching the light detecting means 9 through the container 1 and the light waveguide 7b is measured. At this time, since the amount of attenuation of the light varies with the height of the liquid surface of the material solution in the optical path in the container 1, the residual amount of the material solution can be found from the change of the intensity of the light detected by the light detecting means 9.

Thus, according to the fourth embodiment of the present invention, light output from the point light source 8 is introduced in the material solution 2 in the container through the light waveguide 7a, and the light waveguide 7b is disposed so that the light coming out of the liquid surface through the material solution 2 is detected by the light detecting means 9. Thus, the residual amount of the material solution 2 is detected on the basis of the light intensity received by the light detecting means 9. Consequently, the residual amount of the material solution 2 can be detected in a simple structure without providing a moving part in the container 2, whereby the reliability of the apparatus can be improved and also manufacturing costs can be reduced.

In addition, although the light is continuously output from the light source 8 in the above embodiment, the light may be intermittently output as a pulse from the light source 8 and the time for exchanging the material solution detected from the change in of time taken for the light to reach the light detecting means 9 from the light source 8.

Figure 5:
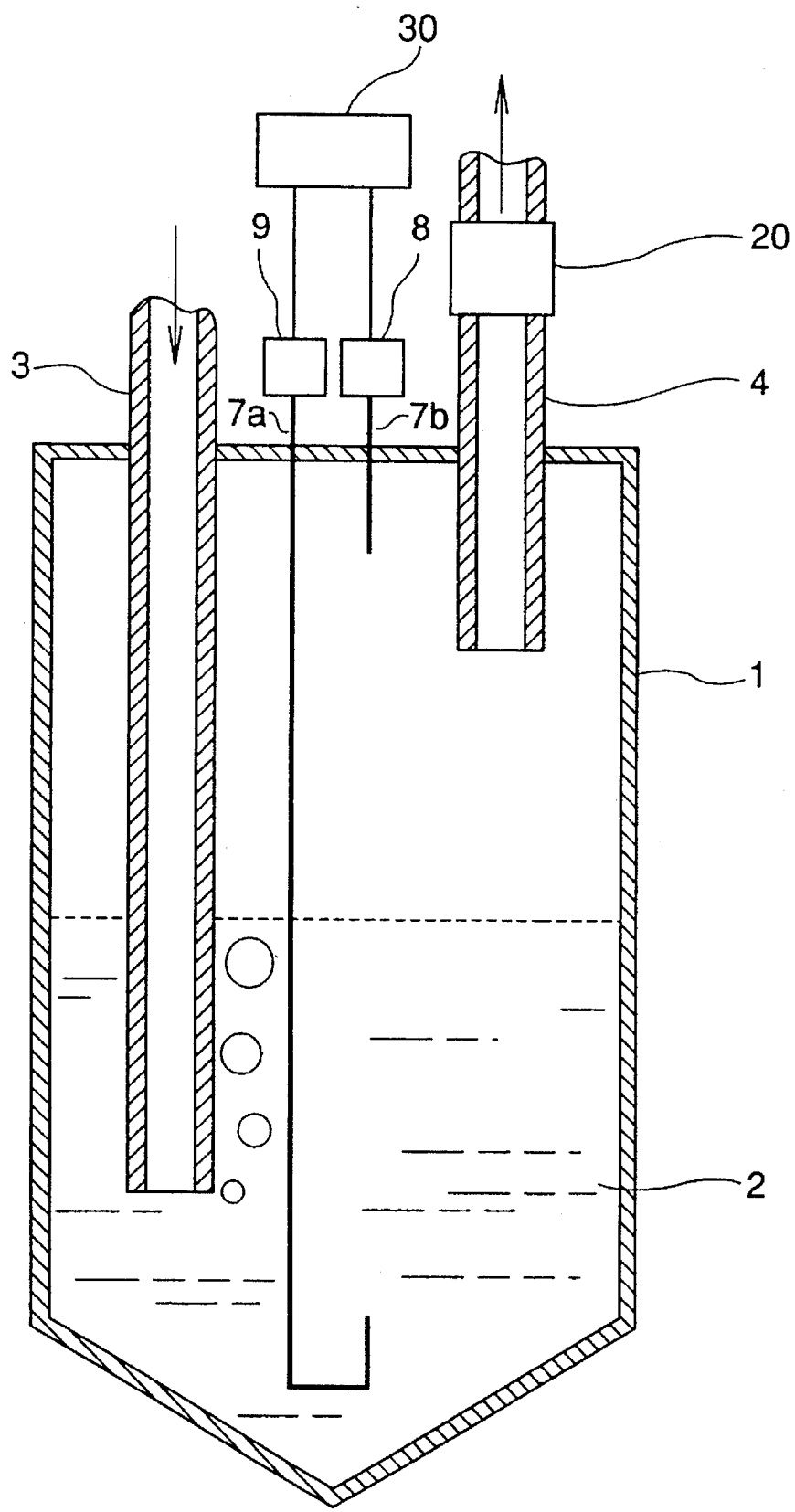
FIG. 5 is a sectional view showing a material supplying apparatus of another structure according to the fourth embodiment of the present invention.

In addition, although the light is output from the light waveguide 7a immersed in the material solution 2 and the light is received by the light waveguide 7b disposed above the liquid surface of the material solution 2 in the fourth embodiment of the present invention, the light waveguide 7a may be connected to the point light source 8, the light waveguide 7b may be connected to the light detecting means 9 and the light may be output from the above toward liquid surface of the material solution 2 as shown in FIG. 5.

Embodiment 5

Figure 6:
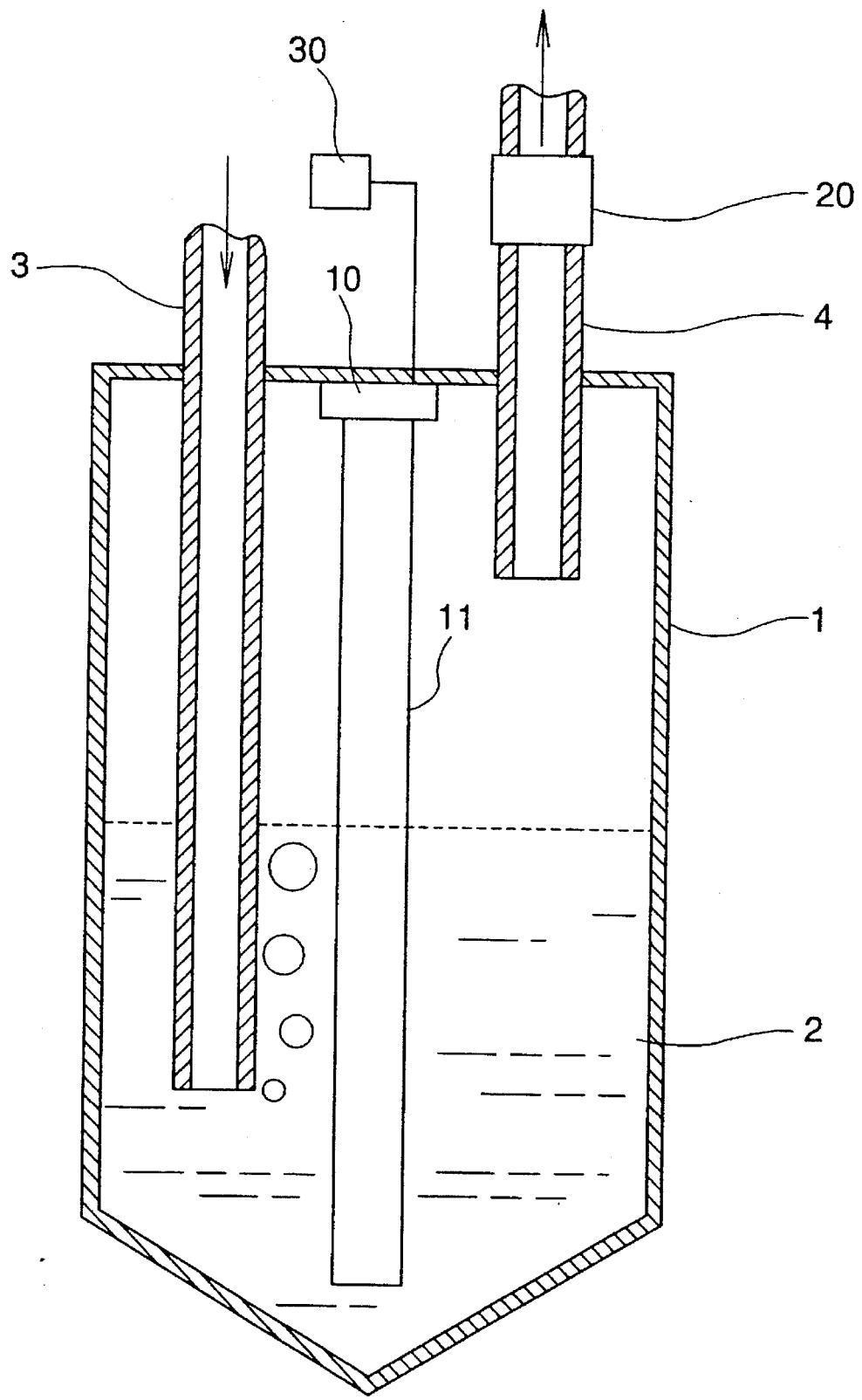
FIG. 6 is a sectional view showing a material supplying apparatus according to a fifth embodiment of the present invention.

FIG. 6 is a sectional view showing a material supplying apparatus according to a fifth embodiment of the present invention. In FIG. 6, pressure detecting means 10 is fixed to an upper portion in the container 1, which, for example, detects pressure using the piezoelectric effect with a piezo element. A stick 11 is fixed to the sensor 10 and disposed so that a lower portion thereof is under the liquid surface of the material solution 2 when the use of the material is completed. The stick may be made of any material that is not dissolved by the material solution 2 and its specific gravity may be higher or lower than that of the material solution 2.

Next, an operation of the apparatus at the time of crystal growth will be described.

The pressure detecting means 10 receives a resultant force of a weight applied to the stick 11 and the buoyancy of the stick 11 from the gas and the material solution 2 in the container 1. Then, the liquid surface of the material solution 2 is lowered as the residual amount of the material solution 2 is reduced and, accordingly, the buoyancy of the stick 11 is reduced. The buoyancy of the stick 11 is detected by the pressure detecting means 10 and calculated by the calculating means 30, whereby the residual amount of the material solution 2 can be obtained.

Embodiment 6

Figure 7:
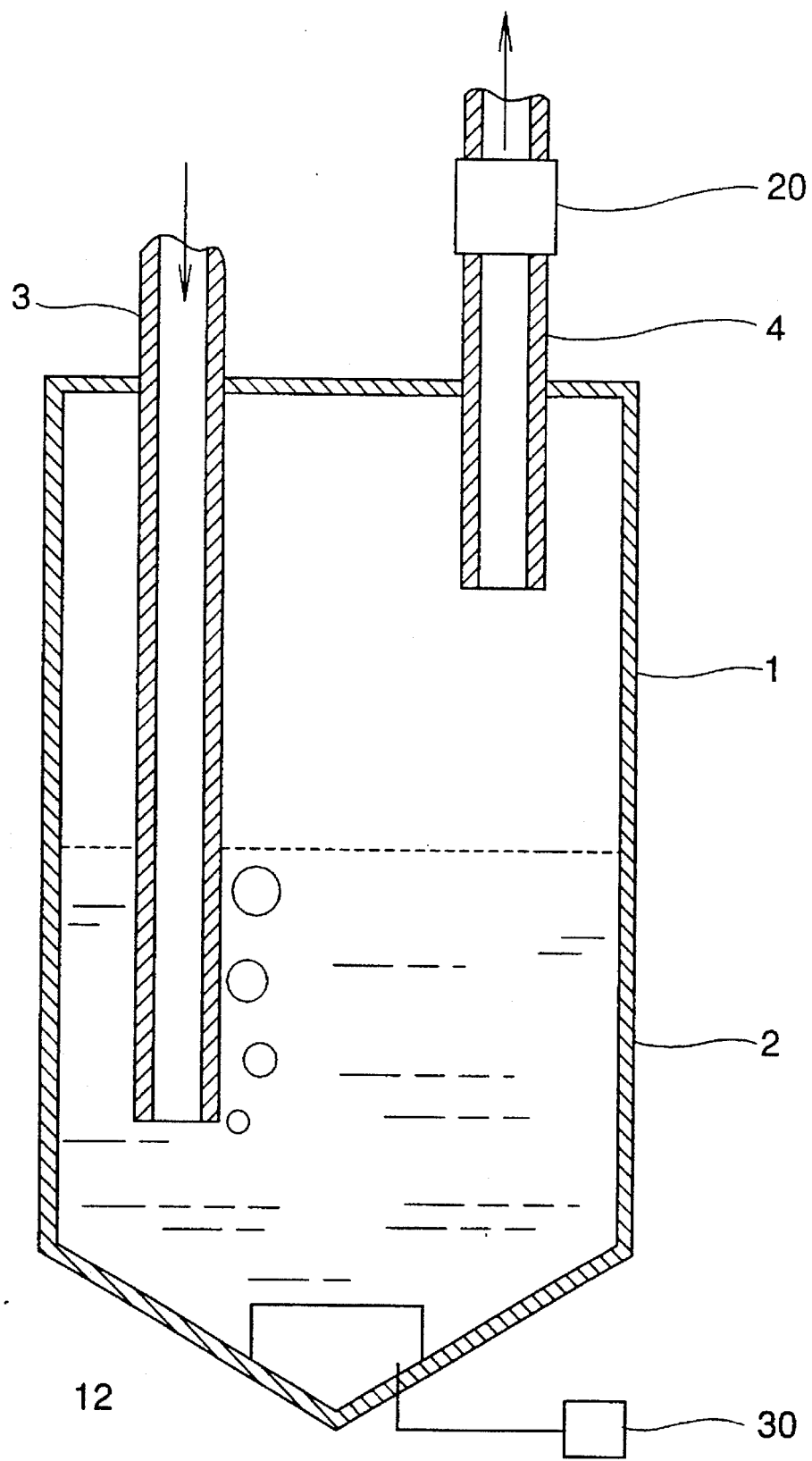
FIG. 7 is a sectional view showing a material supplying apparatus according to a sixth embodiment of the present invention.

FIG. 7 is a sectional view showing a material supplying apparatus according to a sixth embodiment of the present invention. In FIG. 7, pressure detecting means 12 is disposed at a bottom of the container 1. For example, the sensor detects pressure using the piezoelectric effect with a piezo element, whereby the pressure applied from the material solution 2 to the bottom of the container 1 is measured. A detecting signal of the pressure detecting means 12 is input to the calculating means 30 disposed outside the container 1.

Next, an operation of the apparatus at the time of crystal growth will be described.

The pressure detecting means 12 is disposed at a lower portion of the container 1 and receives a pressure according to a height of the liquid surface of the material solution 2 and the specific gravity of the material solution 2. The pressure is detected and calculated by the calculating means 30 disposed outside the container 1. Consequently, the residual amount of the material can be detected.

As described above, according to the material supplying apparatus of the present invention, the residual amount of the material or the time to exchange the material can be found in a simple structure having no moving part by detecting the capacitance of a capacitor formed in the container and that varies according to the residual amount of the material.

In addition, according to the material supplying apparatus of the present invention, the residual amount of the material solution or the time to exchange the material solution can be found in a simple structure having no moving part by detecting the attenuation of light passing through the container which varies according to the residual amount of the material.

In addition, according to the material supplying apparatus of the present invention, the residual amount of the material or the time to exchange the material can be found in a simple structure having no moving part by detecting the transit time for light passing through the container the transit time varying according to the residual amount of the material.

In addition, according to the present invention, the residual amount of the material solution or the time to exchange it can be calculated in a simple structure having no moving part by detecting the buoyancy of the stick which varies according to the residual amount of the material solution.

In addition, according to the material supplying apparatus of the present invention, the residual amount of the material can be found in a simple structure having no moving part by detecting a liquid pressure at the bottom of the container which varies according to the residual amount of the material.

What is claimed is:

1. A material supplying apparatus comprising:

a container for storing a solution and including an inlet pipe for introducing a carrier gas and an outlet pipe, the container having a depth direction;

electrodes along all of the depth direction of the container and forming a capacitor; and means for measuring electrical capacitance of the capacitor formed by the electrodes and thereby determining the quantity of a solution in the container.

2. A material supplying apparatus according to claim 1 wherein the container is made of metal and used as one of electrodes forming the capacitor.

3. The material supplying apparatus according to claim 1 wherein one of the electrodes of the capacitor is tubular and the other electrode is one of a column and a cylinder and disposed inside the tubular electrode.

4. The material supplying apparatus according to claim 1 wherein the electrodes are parallel plates disposed inside the container.

* * * * *

UNITED STATES PATENT AND TRADEMARK OFFICE
CERTIFICATE OF CORRECTION

PATENT NO. : 5,582,647
DATED : December 10, 1996
INVENTOR(S) : Kato et al.

It is certified that error appears in the above-indentified patent and that said Letters Patent is hereby corrected as shown below:

```
Column 6, Line 23, change "A" to --The--;

Line 24, change "used as one" to --is one of the--.
```

Signed and Sealed this

Fifteenth Day of April, 1997

Attest:

BRUCE LEHMAN

Attesting Officer    Commissioner of Patents and Trademarks